(12) United States Patent
Shao et al.

(10) Patent No.: US 11,388,832 B2
(45) Date of Patent: Jul. 12, 2022

(54) BLIND-MATE CONNECTION DESIGN FOR LIQUID-COOLED ELECTRONIC RACKS

(71) Applicant: Baidu USA LLC, Sunnyvale, CA (US)

(72) Inventors: Shuai Shao, Sunnyvale, CA (US); Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 1 day.

(21) Appl. No.: 16/886,369

(22) Filed: May 28, 2020

(65) Prior Publication Data

US 2021/0378124 A1 Dec. 2, 2021

(51) Int. Cl.
*H05K 7/14* (2006.01)
*H05K 7/20* (2006.01)

(52) U.S. Cl.
CPC ....... *H05K 7/1488* (2013.01); *H05K 7/20781* (2013.01); *H05K 7/20836* (2013.01)

(58) Field of Classification Search
CPC ............. H05K 7/1488; H05K 7/20781; H05K 7/20836; H05K 7/2079; H05K 7/20272
USPC .......................................................... 211/26
See application file for complete search history.

(56) References Cited

U.S. PATENT DOCUMENTS

| | | | | |
|---|---|---|---|---|
| 7,450,385 B1 * | 11/2008 | Campbell | .......... | H05K 7/20772 165/80.4 |
| 7,950,244 B2 * | 5/2011 | Iyengar | .............. | H05K 7/20781 62/259.2 |
| 7,990,709 B2 * | 8/2011 | Campbell | ............ | H05K 7/2079 361/696 |
| 8,238,104 B2 * | 8/2012 | Salpeter | ............... | H05K 7/1497 361/716 |
| 8,305,754 B2 * | 11/2012 | Wu | ..................... | H05K 7/20809 361/688 |
| 8,315,052 B2 * | 11/2012 | Chan | .................. | H05K 7/20736 361/695 |
| 8,373,988 B2 * | 2/2013 | Chang | ................. | H05K 7/20736 361/695 |
| 8,436,246 B1 * | 5/2013 | Scofield | ............. | H05K 7/20272 174/137 R |
| 8,456,833 B2 * | 6/2013 | Eagle | .................. | H05K 7/20272 361/679.47 |
| 8,955,347 B2 * | 2/2015 | Campbell | .......... | H05K 7/20745 62/259.2 |
| 9,055,690 B2 * | 6/2015 | Ross | .................... | H05K 7/1487 |

(Continued)

*Primary Examiner* — Stanton L Krycinski
(74) *Attorney, Agent, or Firm* — Womble Bond Dickinson (US) LLP

(57) ABSTRACT

A holder for connecting a rack manifold of an electronic rack and a room manifold of a data center room to provide liquid cooling to the electronic rack includes an L-shaped frame with a first arm having a first end and a second end, and a second arm extending from the second end of the first arm and substantially perpendicular to the first arm. The holder additionally includes a pivot point to be coupled to a pivot connector on a panel to pivotally move the L-shaped frame between a first position and a second position. The holder further includes a first blind-mate connector disposed on the L-shaped frame to be coupled to a second blind-mate connector at an engagement interface. The first blind-mate connector and the second blind-mate connector are coupled in response to the L-shaped frame moving to the second position in response to contact with the electronic rack.

20 Claims, 5 Drawing Sheets

(56) References Cited

U.S. PATENT DOCUMENTS

| | | | |
|---|---|---|---|
| 9,060,451 B2 * | 6/2015 | Clidaras | H05K 7/20754 |
| 9,095,070 B2 * | 7/2015 | Ross | H05K 7/1488 |
| 9,155,230 B2 * | 10/2015 | Eriksen | H05K 7/1488 |
| 9,282,683 B2 * | 3/2016 | Bousseton | H05K 7/20836 |
| 9,363,926 B1 * | 6/2016 | Beall | G11B 33/128 |
| 9,507,393 B2 * | 11/2016 | Alshinnawi | H05K 7/20781 |
| 9,538,688 B2 * | 1/2017 | Fricker | H05K 7/20809 |
| 9,609,788 B2 * | 3/2017 | Kawamoto | H05K 7/20572 |
| 10,010,013 B2 * | 6/2018 | Shelnutt | H05K 7/1488 |
| 10,164,373 B1 * | 12/2018 | Cheon | H01R 13/631 |
| 10,178,801 B2 * | 1/2019 | Liu | H05K 7/183 |
| 10,356,957 B2 * | 7/2019 | Franz | H05K 7/1488 |
| 10,375,862 B2 * | 8/2019 | Edge | H05K 7/20145 |
| 10,375,863 B2 * | 8/2019 | Moss | H05K 7/1488 |
| 10,398,060 B1 * | 8/2019 | Beall | G11B 33/00 |
| 10,405,458 B2 * | 9/2019 | Fukunaga | H01R 13/2478 |
| 10,485,140 B2 * | 11/2019 | Kawamoto | H05K 7/186 |
| 10,813,246 B2 * | 10/2020 | Lin | H05K 7/20809 |
| 10,881,017 B2 * | 12/2020 | Michna | H05K 7/1452 |
| 10,925,187 B1 * | 2/2021 | Coxe, III | H05K 7/20736 |
| 10,925,189 B2 * | 2/2021 | Cheong | H05K 7/1488 |
| 11,064,628 B2 * | 7/2021 | Thibaut | H05K 7/1489 |
| 11,140,799 B2 * | 10/2021 | Gao | H05K 7/2079 |
| 2013/0306269 A1 * | 11/2013 | Helbig | F28F 9/007 165/67 |
| 2015/0076975 A1 * | 3/2015 | Peng | H05K 7/1488 312/201 |
| 2016/0066480 A1 * | 3/2016 | Eckberg | F16L 37/30 361/679.53 |
| 2016/0353613 A1 * | 12/2016 | Chen | H05K 7/20781 |
| 2017/0127575 A1 * | 5/2017 | Lunsman | H05K 7/20772 |
| 2017/0257980 A1 * | 9/2017 | Fukunaga | H01R 13/005 |
| 2018/0295750 A1 * | 10/2018 | Ortenzi | H05K 7/1488 |
| 2019/0182989 A1 * | 6/2019 | Chen | H05K 7/20781 |
| 2021/0267095 A1 * | 8/2021 | Heydari | H05K 7/2079 |

* cited by examiner

BLIND-MATE CONNECTION DESIGN FOR LIQUID-COOLED ELECTRONIC RACKS

FIELD OF THE DISCLOSURE

Embodiments of the present invention relate generally to data centers. More particularly, embodiments of the invention relate to connection system for liquid cooling of electronic racks in data centers.

BACKGROUND

High performance machine learning computing drives demand for an effective thermal management such as a liquid cooling system. Computing-intensive application scenarios in high-performance machine learning industry includes image classification, object detection, and translation. The liquid cooling system helps reducing the cost and enhancing thermal performance when performing such computing-intensive tasks. Accordingly, the liquid cooling system provides an effective way to solve challenges in thermal management and save the cooling power usage.

In liquid cooling systems, key components such as connectors require a proper design and implementation to ensure the reliability of the connectors and the design consideration on the rack manifold and the room level fluid supply/return system. In the past, connectors such as barbed fittings are often used to connect an electronic room manifold port and an electronic rack manifold port. However, due to large pipe size and hose bending angle, connectors failure rate is high. Additionally, connectors failure rate is further exacerbated by other associated technical challenges in transportation, handling, and assembly.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
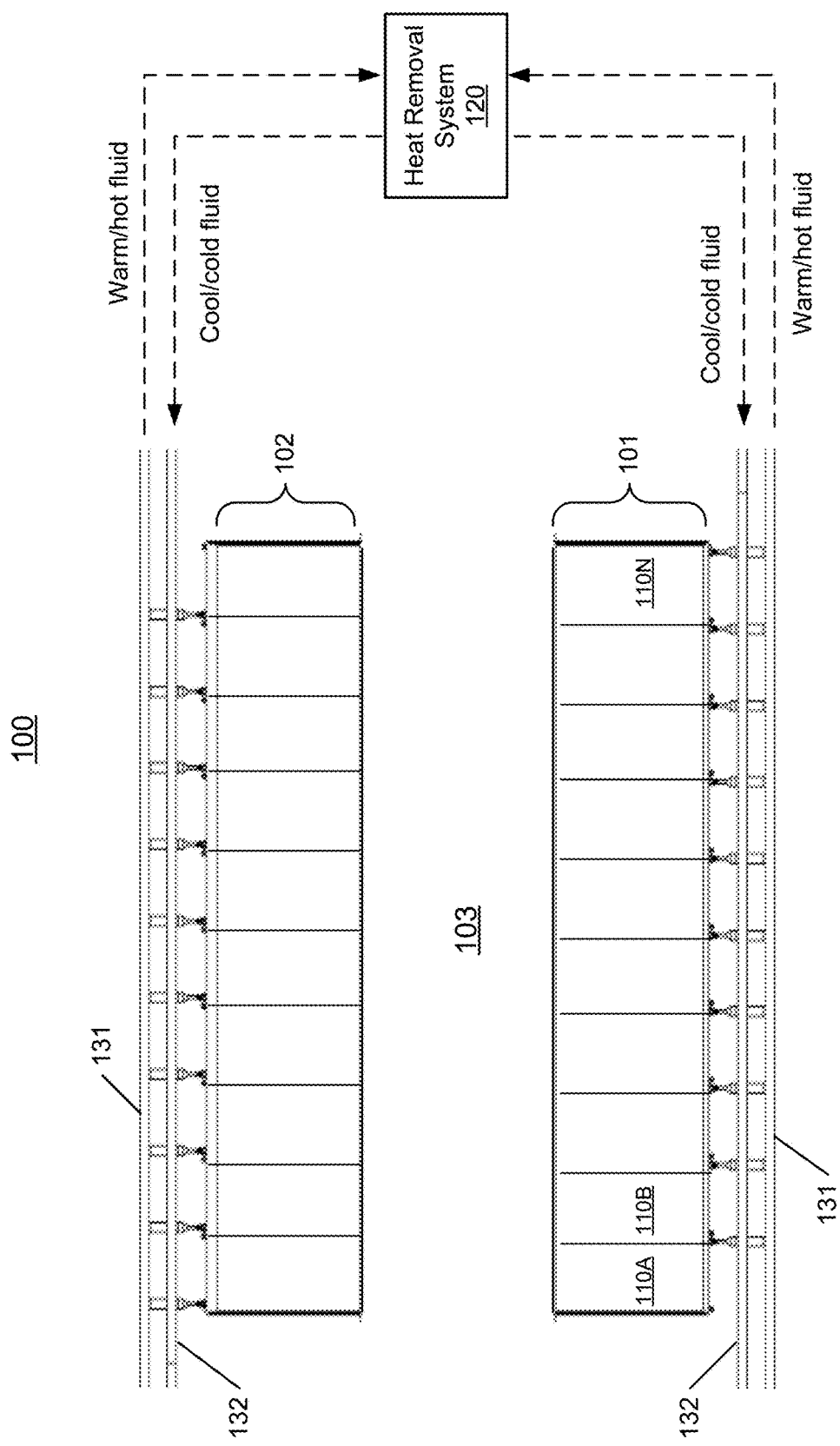
FIG. 1 is a block diagram illustrating an example of a data center system according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the present disclosure focus on an improvement of design of a connecting interface for a liquid-cooled electronic rack in a liquid cooling system. Such connecting interface is utilized to connect electronic racks and a room fluid supply/return system. The concept proposed herein is to design and operate a connecting interface for the liquid-cooled electronic rack using a complete blind-mate interface and a self-engaging mechanism. Blind-mate interface may include blind-mate connectors designed where multiple connectors need to be mated simultaneously in blind mate conditions, as will be understood by those skilled in the art. The blind-mate connectors have self-aligning features which allow for misalignment when mating. The blind-mate connectors may mate either via a sliding or snapping mechanism, as will be understood by those skilled in the art. The blind-mate connectors provide blind mating dripless quick disconnect resulting in an ease of a server installation, no requirement on manual operation for fluid connectors, etc.

A complete blind-mate interface design connects a rack manifold (e.g., server chassis) to a room manifold (e.g., a room fluid supply/return system). The benefits of having a complete blind-mate interface design, among others, include reducing a failure of large size connectors, and ease of handling and assembling. Such complete blind-mate interface design eliminates the use of flexible hoses and barbed fittings. Barbed fittings, also known as hose barbed connectors, are commonly used as flow control components, as will be understood by those skilled in the art. A self-engaging mechanism utilizing a new holder is implemented to couple blind-mate interfaces between a rack manifold and a room manifold.

In particular, the blind-mate interface is positioned to couple the holder to the electronic rack. As the electronic rack is pushed into a designated position in a data center system, for example, the holder moves from a first position to a second position. Accordingly, the holder is coupled to the electronic rack via the blind-mate interface and the room manifold is connected to the rack manifold. The connecting interface design described herein includes a rack manifold with a connector on its top side, to be coupled to a room manifold. The benefits of this configuration include reducing the risk of connector failure, eliminating the air in the fluid accumulated in the rack manifold so that no air purging is needed for the rack manifold.

Embodiments of the present disclosure disclose an L-shaped frame holder equipped with a blind-mate interface. The holder is designed for a relatively large pipe size. A first arm (e.g., lower portion) of the holder is attached to a panel structure (e.g., a wall) in an (information technology) IT room with a compression spring. A second arm (e.g., upper portion) of the holder includes a blind-mate interface and a barbed fitting. The joint of the first and second arms is fastened to the panel structure in the IT room and the holder can pivot about the joint. The panel structure is fixed in the IT room. The holder is connected to a room manifold via a flexible hose coupled to barbed fittings. The holder is coupled to a rack manifold via the blind-mate interface, either male or female.

According to one embodiment, a holder for an electronic rack includes an L-shaped frame with a first arm having a first end and a second end, and a second arm extending from the second end of the first arm and substantially perpendicular to the first arm. The holder additionally includes a pivot point to be coupled to a pivot connector on a panel to move the L-shaped frame between a first position and a second position. The holder additionally includes a first blind-mate connector disposed on the second arm of the L-shaped frame to be coupled to a second blind-mate connector at an engagement interface. The second blind-mate connector is mounted on the rack manifold. The first blind-mate connector and the second blind-mate connector are coupled in response to the L-shaped frame moving to the second position in response to contact with the electronic rack.

In another embodiment, the holder also includes a compression spring to be coupled to the panel and the first end of the first arm of the L-shaped frame to maintain the L-shaped frame in the first position, such that the first arm of the L-shaped frame is maintained at a predetermined angle with respect to the panel.

In one disclosed embodiment, the holder additionally includes a first barbed fitting coupled to the first blind-mate connector, a second barbed fitting coupled to a room manifold, and a flexible hose being coupled to the first barbed fitting and the second barbed fitting, the flexible hose providing a fluid communication between the room manifold and the rack manifold when the L-shaped frame is in the second position.

In yet another disclosed embodiment, the holder further includes a guide pin hole disposed on the first arm of the L-shaped frame and a guide pin disposed on a backend of the rack manifold. The guide pin is coupled to the guide pin hole to confirm a position of the engagement interface in response to contact with the electronic rack.

In another disclosed embodiment, the engagement interface connects the rack manifold to the room manifold in response to the L-shaped frame moving to the second position in response to contact with the electronic rack.

In a further disclosed embodiment, the first arm of the L-shaped frame extends substantially downwardly parallel to the panel when the L-shaped frame is in the second position.

According to an embodiment of the present disclosure, the room manifold includes a supply room manifold to distribute heat removal liquid from an external heat removal system to the rack manifold via the flexible hose when the L-shaped frame is in the second position.

In another embodiment, the room manifold includes a return room manifold to transfer the heat removal liquid from the rack manifold to the external heat removal system via the flexible hose when the L-shaped frame is in the second position.

According to one embodiment, the rack manifold includes the rack manifold includes a supply rack manifold in fluid communication with the supply room manifold when the L-shaped frame is in the second position, the supply rack manifold being connected to an IT equipment via a blind-mate connection.

In one disclosed embodiment, the rack manifold includes a return rack manifold in fluid communication with the return room manifold when the L-shaped frame is in the second position, the return rack manifold being connected to an IT equipment via a blind-mate connection.

In another embodiment, the compression spring exerts an amount of force on the electronic rack in response to the electronic rack weight to keep the electronic rack stationary when the L-shaped frame is in the second position.

In a further disclosed embodiment, the second blind-mate connector is coupled to a rack manifold connector positioned at a top portion of the rack manifold to eliminate an accumulation of air bubble surrounding the top portion of the rack manifold.

In yet another disclosed embodiment, the rack manifold is affixed to the electronic rack to keep the rack manifold stationary when the L-shaped frame is in the second position.

According to another aspect, the above system can be implemented in a data center. The data center includes a room manifold and multiple electronic racks positioned in multiple rows. Each of the multiple electronic racks is coupled to the room manifold via a holder described in the above system.

FIG. 1 is a block diagram illustrating a data center system 100 according to one embodiment of the present disclosure. In this example, FIG. 1 shows a top view of at least a portion of a data center. Referring to FIG. 1, according to one embodiment, the data center system 100 includes rows of electronic racks of IT components, equipment or instruments 101-102, such as, for example, computer servers that provide data services to a variety of clients. In this embodiment, the data center system 100 includes electronic racks, such as electronic racks 110A-110N, arranged in row 101 and row 102. However, more or fewer rows of electronic racks may be implemented. Typically, rows 101-102 are aligned in parallel with frontends facing each other and backends facing away from each other, forming aisle 103 in between to allow an administrative person to walk therein. However, other configurations or arrangements may also be applied.

In one embodiment, each of the electronic racks (e.g., electronic racks 110A-110N) includes a back panel, a number of server slots, and a number of server blades capable of being inserted into and removed from the server slots. Each server blade includes a processor (e.g., CPU or GPU), a memory, and/or a persistent storage device (e.g., hard disk), which represents a computer server. The back panel is disposed on a backend of the electronic rack. The back panel includes a heat removal liquid manifold assembly to provide heat removal liquid from an external heat removal system 120 to remove heat from the server blades. Each server blade can be inserted and removed from a corresponding server slot from a frontend of the electronic rack. Heat removal system 120 may be a chiller system with an active refrigeration cycle. Alternatively, heat removal system 120 can include but is not limited to evaporative cooling, free air, rejection to large thermal mass, and waste heat recovery designs, as will be understood by those skilled in the art.

In one embodiment, each of the electronic racks in rows 101-102 includes a heat removal liquid manifold, a number of server blades contained in a number of server blade slots respectively, and a coolant distribution unit (CDU). The heat removal liquid manifold is to provide heat removal liquid to each of the server blades. Each of the server blades is to receive heat removal liquid from the heat removal liquid manifold, to remove at least a portion of the heat generated by an IT component of the server blade using the heat removal liquid manifold, and to transmit warmer liquid carrying the heat exchanged from the IT component back to the heat removal liquid manifold. The CDU is configured to receive data representing a workload of the IT components of the server blades and to control a liquid flow rate of the heat removal liquid supplied to the heat removal liquid manifold based on the workload of the IT components of the server blades.

The heat removal liquid manifold disposed on the backend of each electronic rack is coupled to liquid supply line 132 to receive heat removal liquid from heat removal system 120. The heat removal liquid is to remove heat from the IT component. The resulting warmer or hotter liquid carrying the heat exchanged from the IT component is transmitted via return line 131 back to heat removal system 120. Liquid supply/return lines 131-132 are referred to as data center liquid supply/return lines (e.g., global liquid supply lines), which supply heat removal liquid to all of the electronic racks of rows 101-102.

Figure 2:
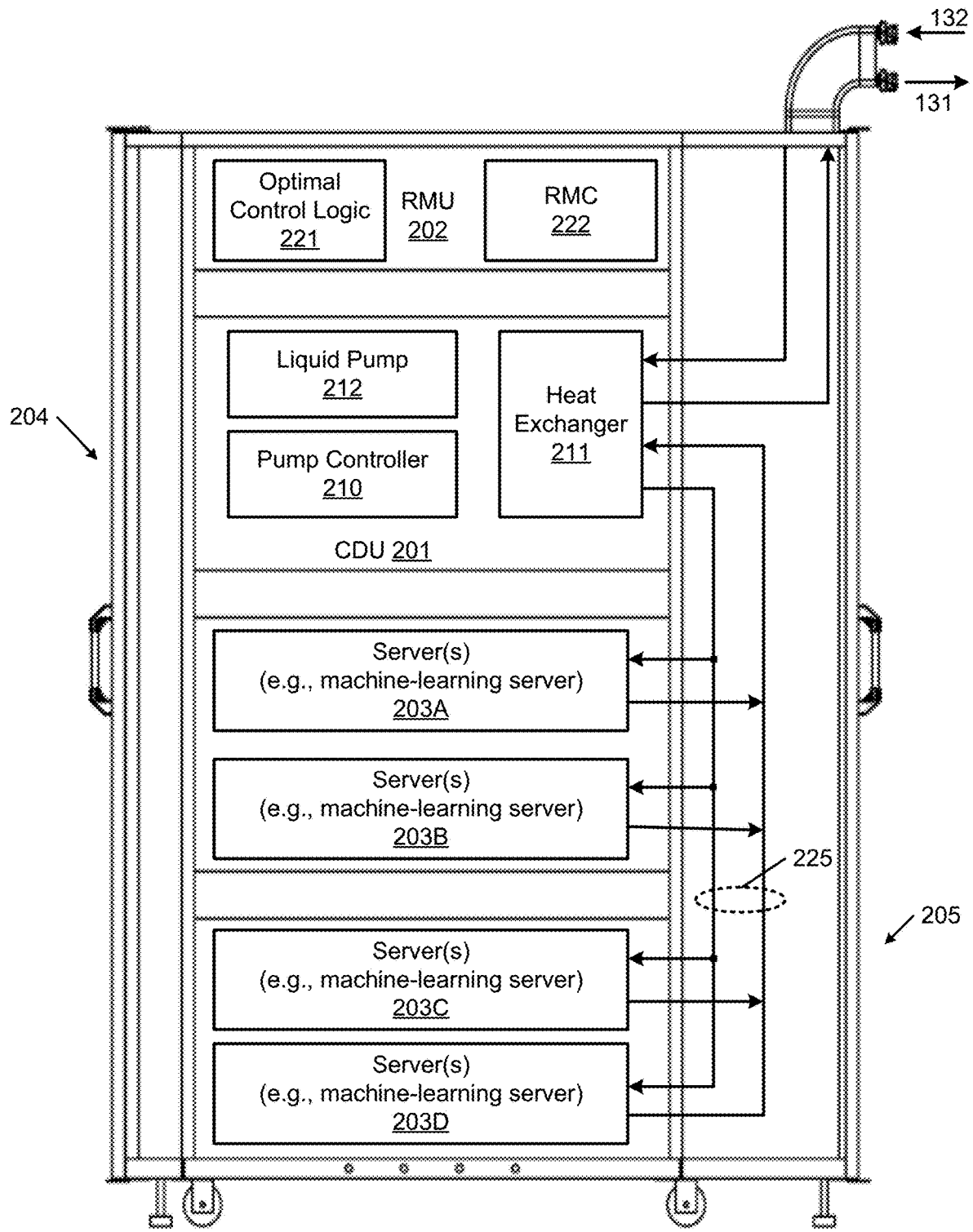
FIG. 2 is a block diagram illustrating an example of an electronic rack according to one embodiment.

FIG. 2 is a block diagram illustrating a side view of an electronic rack according to one embodiment of the invention. Electronic rack 200 may represent any of the electronic racks of rows 101-102 of FIG. 1 such as electronic racks 110A-110N. Referring to FIG. 2, in one embodiment, electronic rack 200 includes CDU 201, RMU 202, and one or more server blades 203A-203D, collectively referred to as server blades 203. Server blades 203 can be inserted into an array of server slots respectively from frontend 204 of electronic rack 200. Note that although there are only four server blades 203A-203D shown in FIG. 2, more or fewer server blades may be maintained within electronic rack 200. Also note that the particular positions of CDU 201, RMU 202, and server blades 203 are shown for the purpose of illustration only; other arrangements or configurations of CDU 201, RMU 202, and server blades 203 may also be implemented. Further, the front door disposed on frontend 204 and the back door disposed on backend 205 are optional. In some situations, there may be no door on frontend 204 and/or backend 205.

In one embodiment, CDU 201 includes heat exchanger 211, liquid pump 212, and pump controller 210. Heat exchanger 211 may be a liquid-to-liquid heat exchanger. Heat exchanger 211 includes a first tube having a first pair of liquid connectors coupled to external liquid supply/return lines 131-132 to form a primary loop, where the connectors coupled to the external liquid supply/return lines 131-132 may be disposed or mounted on backend 205 of electronic rack 200. In addition, heat exchanger 211 further includes a second tube having a second pair of liquid connectors coupled to liquid manifold 225, which may include a supply manifold to supply cooling liquid to server blades 203 and a return manifold to return warmer liquid back to CDU 201. The processors may be mounted on the cold plates, where the cold plates include a liquid distribution channel embedded therein to receive the cooling liquid from the liquid manifold 225 and to return the cooling liquid carrying the heat exchanged from the processors back to the liquid manifold 225.

Each of server blades 203 may include one or more IT components (e.g., CPUs, GPUs, memory, and/or storage devices). Each IT component may perform data processing tasks, where the IT component may include software installed in a storage device, loaded into the memory, and executed by one or more processors to perform the data processing tasks. Server blades 203 may include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which may generate heat during the operations.

Electronic rack 200 further includes RMU 202 configured to provide and manage power supplied to server blades 203 and CDU 201. RMU 202 may be coupled to a power supply unit (not shown) to manage the power consumption of the power supply unit, as well as other thermal management of the power supply unit (e.g., cooling fans). The power supply unit may include the necessary circuitry (e.g., an alternating current (AC) to direct current (DC) or DC to DC power converter, battery, transformer, or regulator, etc.,) to provide power to the rest of the components of electronic rack 200.

In one embodiment, RMU 202 includes optimal control logic 221 and rack management controller (RMC) 222. The optimal control logic 221 is coupled to at least some of server blades 203 to receive operating status of each of the server blades 203, such as processor temperatures of the processors, the current pump speed of the liquid pump 212, and liquid temperature of the cooling liquid, etc. Based on this information, optimal control logic 221 determines an optimal pump speed of the liquid pump 212 by optimizing a predetermined objective function, such that the output of the objective function reaches the maximum while a set of predetermined constraints is satisfied. Based on the optimal pump speed, RMC 222 is configured to send a signal to pump controller 210 to control the pump speed of liquid pump 212 based on the optimal pump speed.

Figure 3A:
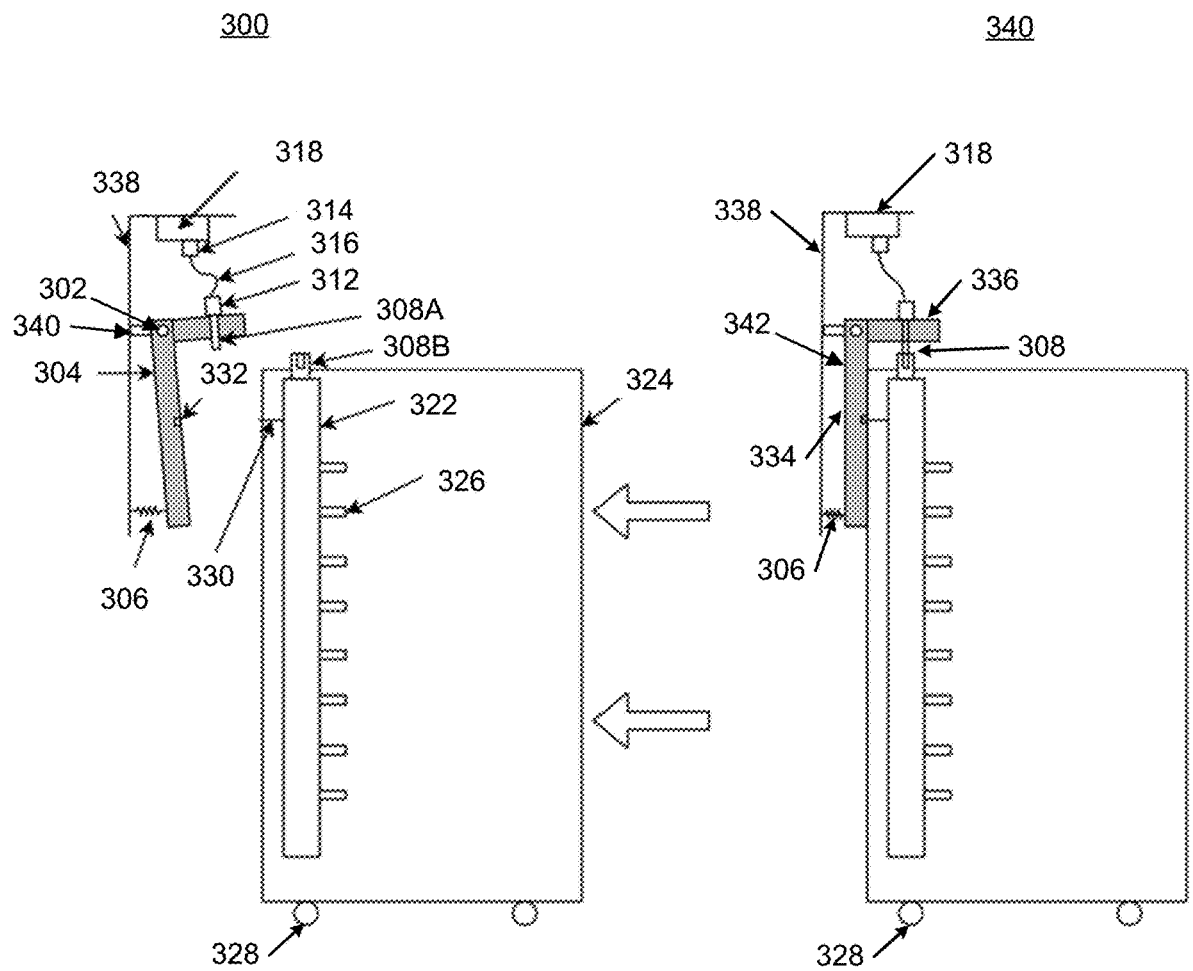
FIGS. 3A and 3B are block diagrams illustrating an example of a liquid cooling blind-mate connection between a rack manifold and a room manifold via a holder before an electronic rack is pushed into a designated position and after the electronic rack is pushed into a designated position and the blind-mating is engaged according to an embodiment.

FIG. 3A is a block diagram illustrating an example of a simplified electronic rack according to one embodiment. Electronic rack 324 may be implemented as a part of electronic rack 200 as shown in FIG. 2. The present disclosure is directed to a holder 304 for an electronic rack 324, for example, as illustrated in FIG. 3A, according to an embodiment. In one embodiment shown in FIG. 3A, a holder 304 for an electronic rack 324 includes an L-shaped frame 342. The L-shaped frame 342 includes a first arm 334 having a first end and a second end, and a second arm 336 extending from the second end of the first arm 334 and substantially perpendicular to the first arm 334.

The holder 304 additionally includes a pivot point 302 disposed on the second end of the first arm 334 of the L-shaped frame 342, the pivot point 302 to be coupled to a pivot connector 340 on a panel 338 to pivotally move the L-shaped frame 342 between a first position 300 and a second position 340. Panel 338 may be a back panel that receive the electronic rack pushed into a corresponding rack slot as shown in FIG. 1. In one embodiment, the electronic rack 324 includes a housing to store a number of server slots to receive a server blade.

In addition, the holder 304 includes a first blind-mate connector 308A disposed on the second arm 336 of the L-shaped frame 342 to be coupled to a second blind-mate connector 308B at an engagement interface 308. The second blind-mate connector 308B is mounted on a rack manifold 322 of the electronic rack 324. The first blind-mate connector 308A and the second blind-mate connector 308B are coupled in response to the L-shaped frame 342 moving to the second position 340 in response to contact with the electronic rack 324 when the electronic rack 324 is pushed into a designated position.

After the first blind-mate connector 308A has been coupled to the second blind-mate connector 308B, a fluid path is formed between the room manifold 318 and the rack manifold 322. In other words, the room manifold 318 is fluidly coupled to the rack manifold 322 via an engagement interface 308. As used herein, "fluidly coupled" means coupled in such a way that fluid can be exchanged; thus, if two elements are fluidly coupled, fluid can flow in one or both directions between them.

In another embodiment, the holder 304 further includes a compression spring 306 to be coupled to the panel 338 and the first end of the first arm 334 of the L-shaped frame 342 to maintain the L-shaped frame 342 in the first position 300, such that the first arm 334 of the L-shaped frame 342 is maintained at a predetermined angle with respect to the panel 338. In one embodiment, the predetermined angle, for example, is approximately 5° (degrees). Before a liquid-cooled electronic rack is pushed into a designated position, the first arm 334 of the holder 304 is tilted by an angle (e.g., 5°), with respect to the panel 338, due to a resistance from a compression spring 306.

In yet another disclosed embodiment, the holder 304 further includes a first barbed fitting 312 coupled to the first blind-mate connector 308A, a second barbed fitting 314 coupled to a room manifold 318, and a flexible hose 316 being coupled to the first barbed fitting 312 and the second barbed fitting 314. The flexible hose provides a fluid communication between the room manifold 318 and the rack manifold 322 when the L-shaped frame 342 is in the second position 340.

In one embodiment, before the electronic rack 324 (e.g., a liquid-cooling IT rack) is pushed into a designated position (e.g., in which the holder is in second position 340) in a data center, the holder 304 is initially in first position 300. In such first position 300, the holder 304 is tilted by a predetermined angle due to the resistance of a compression spring 306. The pivot joint 302 of the L-shaped frame 342 is fixed on the panel 338, allowing the holder 304 to pivot about the pivot joint 302. When a liquid-cooling electronic rack is pushed into the designated position, the electronic rack 324 then pushes a first arm 334 of the holder towards the panel 338, pushing the compression spring 306 compressed as shown in FIG. 3B.

Figure 3B:
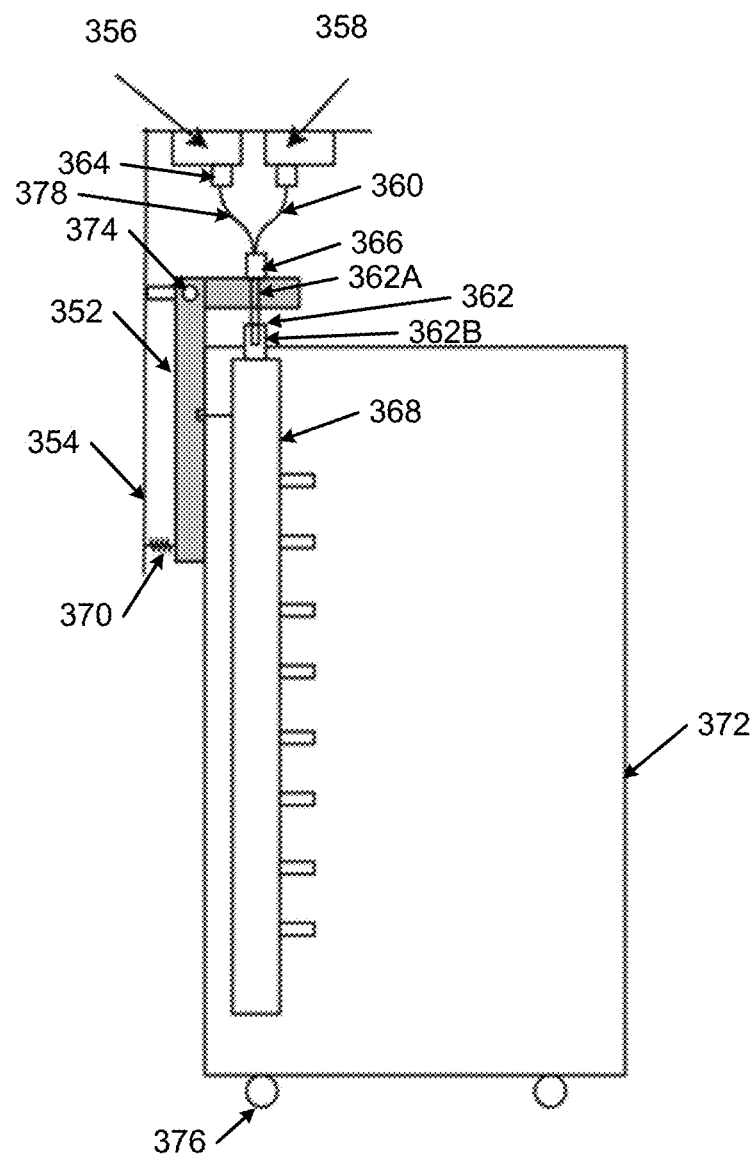

With all the other degrees of freedom being constrained, referring to FIGS. 3A and 3B, the pivot joint 302 of the first arm and the second arm arms is the only degree of freedom for the holder 304. At the same time, the first blind-mate connector 308A on the second arm 336 is coupled onto the second blind-mate connector 308B on the rack manifold 322 to make sure the engagement of the blind-mate engagement interface 308 is complete. The flexible hose 316 between and holder 304 and the room manifold 318 has a sufficient length to allow this pivoting movement when the holder moves from the first position 300 to the second position 340. To make sure the engagement of the electronic rack 324 into the designated position is complete, the electronic rack 324 is pushed into a designated position completely and the wheels 328 of the electronic rack 324 are in a lock mode.

In another disclosed embodiment, the holder 304 further includes a guide pin hole 332 disposed on the first arm 334 of the L-shaped frame 342 and a guide pin 330 disposed on a backend (e.g., rear side) of the rack manifold 322. The guide pin 330 is coupled to the guide pin hole 332 as a mechanism to confirm a position of the engagement interface 308 in response to the L-shaped frame 342 moving to the second position 340 in response to contact with the electronic rack 324.

In some embodiments, for example, the engagement interface 308 connects the rack manifold 322 to the room manifold 318 in response to the L-shaped frame 342 moving to the second position 340 in response to contact with the electronic rack 324.

In one embodiment, the first arm 334 of the L-shaped frame 342 extends substantially downwardly parallel to the panel 338 when the L-shaped frame 342 in the second position 340.

FIG. 3C illustrates an example of a side view connection of the supply and return room manifolds and an electronic rack. In this example, the supply and return rack manifolds are overlapped. Referring to FIG. 3C, in a further disclosed embodiment, the room manifold includes a supply room manifold 358 to distribute heat removal liquid from an external heat removal system 120 (shown in FIG. 1) to the rack manifold 368 via the flexible hose 360 when the L-shaped frame 352 is in the second position. In one embodiment, the room manifold includes a return room manifold 356 to transfer the heat removal liquid from the rack manifold 368 to the external heat removal system via the flexible hose 378 when the L-shaped frame 352 is in the second position.

In one embodiment, the compression spring exerts 370 an amount of force on the electronic rack 372 in response to the electronic rack 372 weight to keep the electronic rack 372 stationary when the L-shaped frame 352 is in the second position. In this manner, the electronic rack 372 is kept in its designated position after the electronic rack 372 has been pushed into a designated position by an operator, for example. The second blind-mate connector is coupled to a rack manifold connector positioned at a top portion of the rack manifold 368 to eliminate an accumulation of air bubble surrounding the top portion of the rack manifold 368.

In another embodiment, for example, the rack manifold 368 is affixed to the electronic rack 372 to keep the rack manifold 368 stationary when the L-shaped frame 352 is in the second position. A first barbed fitting 366 is coupled to the blind-mate connector, a second barbed fitting 364 is coupled to a room manifold 356, and a flexible hose 360 is coupled to the first barbed fitting 366 and the supply room manifold 358. The flexible 360 hose provides a fluid communication between the return room manifold 356 and the rack manifold 368 when the L-shaped frame 352 is in the second position. In a similar manner, a flexible hose 378 is coupled to the first barbed fitting 366 and the return room manifold 356. The flexible 378 hose provides a fluid communication between the return room manifold 356 and the rack manifold 368 when the L-shaped frame 352 is in the second position.

When an electronic rack 372 (e.g., a liquid-cooling electronic rack) is engaged or pushed into a designated position, the electronic rack 372 then pushes the second arm of the L-shaped frame 352 of the holder toward panel 354, compressing compression spring 370. With all the other degrees of freedom being constrained, the L-shaped frame 352 of the holder can only rotate about the pivot point 374. At the same time, the first blind-mate connector 362A on the second arm of the L-shaped frame 352 is coupled to a second blind-mate connector 362B at an engagement interface 362. The second blind-mate connector 362B is mounted on a rack manifold 368. To make sure the engagement of the electronic rack 372 into the designated position is complete, the electronic rack 372 is pushed into a designated position and wheels 376 of the electronic rack 372 are in a lock mode. Because of the heavy weight of the electronic rack 372, the compression spring 370 pushes against the electronic rack 372 and keeps the electronic rack 372 from moving.

Figure 4:
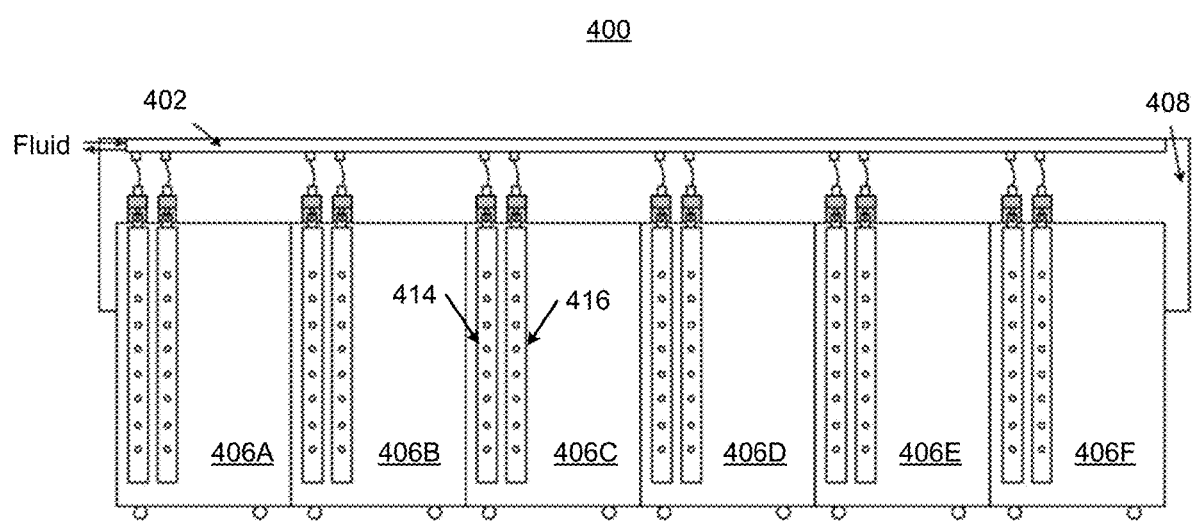
FIG. 4 is a block diagram illustrating an example of supply and return room manifolds being connected to a row of electronic racks according to one embodiment.

FIG. 4 illustrates an example of a data center 400 and an example of overlapped supply and return room manifolds connected to a row of electronic racks. The data center 400 includes a room manifold 402 and electronic racks 406 such as 406A-406F positioned in multiple rows. Each of the electronic racks 406 is coupled to the room manifold 402 via holders. In FIG. 4, supply room manifold and return room manifold are positioned parallel to one another at the same height. When a liquid-cooled electronic rack is pushed into the designated position, the electronic rack such as 406C then pushes a first arm of the holder toward the panel 408, compressing the compression spring.

In one embodiment, the rack supply manifold and rack return manifold of each electronic rack are coupled to the room supply manifold and room return manifold via a pair of holders as described above respectively. As further illustrated in FIG. 4, according to one embodiment, the rack manifold includes a supply rack manifold 414 in fluid communication with the supply room manifold when the L-shaped frame is in the second position. The supply rack manifold 414 is connected to an (information technology) IT equipment via a blind-mate connection. In another embodiment, the rack manifold includes a return rack manifold 416 in fluid communication with the return room manifold when the L-shaped frame is in the second position. The return rack manifold 416 is connected to an IT equipment via a blind-mate connection.

In one embodiment, each of the plurality of electronic racks 406A-406F includes a plurality of rack manifolds 414, 416 positioned side by side. Each of the plurality of rack manifolds, such as 414, is in fluid communication with the room manifold when the L-shaped frame is in the second position.

In another embodiment, the plurality of rack manifolds 414, 416 of each of the plurality of electronic racks 406A-406F is connected to the room manifold 402. The room manifold 402 includes a supply room manifold 358 and a return room manifold 356 (shown in FIG. 3C). As further illustrated in FIG. 3C, the supply room manifold 358 and the return room manifold 356 are positioned side by side and substantially at a same height. The supply room manifold 358 is positioned to distribute heat removal liquid from an external heat removal system (not shown) to the rack manifold 368 via the flexible hose 360 when the L-shaped frame 352 is in the second position. The return room manifold 356 is positioned to transfer the heat removal liquid from the rack manifold 368 to the external heat removal system (not shown) via the flexible hose 378 when the L-shaped frame 352 is in the second position.

In one embodiment, each electronic rack may be fluidly coupled to supply room manifold 358 and return room manifold 356 via a pair of L-shape holders respectively. Alternatively, a single L-shape holder may be used to couple an electronic rack to both supply room manifold 358 and return room manifold 356.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A holder for connecting a rack manifold of an electronic rack and a room manifold of a data center room to provide liquid cooling to the electronic rack, the holder comprising: an L-shaped frame including:
    a first arm having a first end and a second end, and
    a second arm extending from the second end of the first arm and substantially perpendicular to the first arm;
  a pivot point to be coupled to a pivot connector on a panel to pivotally move the L-shaped frame between a first position and a second position; and
  a first blind-mate connector disposed on the second arm of the L-shaped frame to be coupled to a second blind-mate connector at an engagement interface, the second blind-mate connector being mounted on the electronic rack and coupled to the rack manifold of the electronic rack, the first blind-mate connector and the second blind-mate connector being coupled in response to the L-shaped frame moving to the second position in response to contact with the electronic rack.

2. The holder of claim 1, further comprising a compression spring to be coupled to the panel and the first end of the first arm of the L-shaped frame to maintain the L-shaped frame in the first position, such that the first arm of the L-shaped frame is maintained at a predetermined angle with respect to the panel.

3. The holder of claim 1, further comprising:
  a first barbed fitting disposed on the first blind-mate connector to be coupled to a second barbed fitting coupled to the room manifold via a flexible hose, the flexible hose providing a fluid communication between the room manifold and the rack manifold when the L-shaped frame is in the second position.

4. The holder of claim 1, further comprising:
  a guide pin hole disposed on the first arm of the L-shaped frame; and
  a guide pin disposed on a backend of the rack manifold, the guide pin being pushed into the guide pin hole to align a position of the engagement interface in response to contact with the electronic rack.

5. The holder of claim 1, wherein the engagement interface connects the rack manifold to the room manifold in response to the L-shaped frame moving to the second position in response to contact with the electronic rack.

6. The holder of claim 1, wherein the first arm of the L-shaped frame extends substantially downwardly parallel to the panel when the L-shaped frame is in the second position.

7. The holder of claim 1, wherein the room manifold includes a supply room manifold to distribute heat removal liquid from an external heat removal system to the rack manifold and a return room manifold to transfer the heat removal liquid from the rack manifold to the external heat removal system via the flexible hose when the L-shaped frame is in the second position.

8. The holder of claim 7, wherein the rack manifold includes a supply rack manifold in fluid communication with the supply room manifold or a return rack manifold in fluid communication with the return room manifold when the L-shaped frame is in the second position, the supply rack manifold or return rack manifold being connected to an information technology equipment via a blind-mate connection.

9. The holder of claim 2, wherein the compression spring exerts an amount of force on the electronic rack in response to the electronic rack weight to keep the electronic rack stationary when the L-shaped frame is in the second position.

10. The holder of claim 1, wherein the second blind-mate connector is coupled to a rack manifold connector positioned at a top portion of the rack manifold to eliminate an accumulation of air bubbles surrounding the top portion of the rack manifold.

11. The holder of claim 1, wherein the rack manifold is affixed to the electronic rack to keep the rack manifold stationary when the L-shaped frame is in the second position.

12. A data center, comprising:
a room manifold; and
a plurality of electronic racks positioned in a plurality of rows, each of the plurality of electronic racks being coupled to the room manifold via a holder, wherein the holder comprises:
an L-shaped frame including:
a first arm having a first end and a second end, and
a second arm extending from the second end of the first arm and substantially perpendicular to the first arm,
a pivot point to be coupled to a pivot connector on a panel to pivotally move the L-shaped frame between a first position and a second position; and
a first blind-mate connector disposed on the second arm of the L-shaped frame to be coupled to a second blind-mate connector at an engagement interface, the second blind-mate connector being mounted on the electronic rack and coupled to a rack manifold of the electronic rack, the first blind-mate connector and the second blind-mate connector being coupled in response to the L-shaped frame moving to the second position in response to contact with the electronic rack.

13. The data center of claim 12, wherein the holder further comprises a compression spring to be coupled to the panel and the first end of the first arm of the L-shaped frame to maintain the L-shaped frame in the first position, such that the first arm of the L-shaped frame is maintained at a predetermined angle with respect to the panel.

14. The data center of claim 12, wherein the holder further comprises:
a first barbed fitting disposed on the first blind-mate connector to be coupled to a second barbed fitting coupled to the room manifold via a flexible hose, the flexible hose providing a fluid communication between the room manifold and the rack manifold when the L-shaped frame is in the second position.

15. The data center of claim 12, wherein the holder further comprises:
a guide pin hole disposed on the first arm of the L-shaped frame; and
a guide pin disposed on a backend of the rack manifold, the guide pin being pushed into the guide pin hole to align a position of the engagement interface in response to contact with the electronic rack.

16. The data center of claim 12, wherein the engagement interface connects the rack manifold to the room manifold in response to the holder moving to the second position in response to contact with the electronic rack.

17. The data center of claim 12, wherein the first arm of the L-shaped frame extends substantially downwardly parallel to the panel when the L-shaped frame is in the second position.

18. The data center of claim 12, wherein each of the plurality of electronic racks includes a plurality of rack manifolds positioned side by side, each of the plurality of rack manifolds being in fluid communication with the room manifold when the L-shaped frame is in the second position.

19. The data center of claim 18, wherein the plurality of rack manifolds is connected to the room manifold including a supply room manifold and a return room manifold, the supply room manifold and the return room manifold being positioned side by side and substantially at a same height, the supply room manifold being positioned to distribute heat removal liquid from an external heat removal system to the rack manifold via a flexible hose when the L-shaped frame is in the second position, the return room manifold being positioned to transfer the heat removal liquid from the rack manifold to the external heat removal system via the flexible hose when the L-shaped frame is in the second position.

20. The data center of claim 13, wherein the compression spring exerts an amount of force on the electronic rack in response to the electronic rack weight to keep the electronic rack stationary when the L-shaped frame is in the second position.

* * * * *